United States Patent
Becker et al.

(10) Patent No.: US 7,049,244 B2
(45) Date of Patent: May 23, 2006

(54) METHOD FOR ENHANCING SILICON DIOXIDE TO SILICON NITRIDE SELECTIVITY

(75) Inventors: David S. Becker, Boise, ID (US); Guy T. Blalock, Eagle, ID (US); Fred L. Roe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 563 days.

(21) Appl. No.: 09/923,058

(22) Filed: Aug. 6, 2001

(65) Prior Publication Data

US 2002/0000423 A1   Jan. 3, 2002

Related U.S. Application Data

(63) Continuation of application No. 09/344,277, filed on Jun. 30, 1999, now Pat. No. 6,287,978, which is a continuation of application No. 08/905,891, filed on Aug. 4, 1997, now Pat. No. 6,015,760, which is a continuation of application No. 08/152,755, filed on Nov. 15, 1993, now Pat. No. 5,880,036, which is a continuation-in-part of application No. 07/898,505, filed on Jun. 15, 1992, now Pat. No. 5,286,344.

(51) Int. Cl.
*H01L 21/302* (2006.01)

(52) U.S. Cl. ............. 438/714; 438/715; 438/717; 438/740; 438/723; 438/724; 438/743; 438/744

(58) Field of Classification Search ............. 438/714, 438/715, 717, 740, 723, 724, 743, 744
See application file for complete search history.

(56) References Cited

U.S. PATENT DOCUMENTS

| | | |
|---|---|---|
| 3,479,237 A | 11/1969 | Bergh et al. |
| 3,653,898 A | 4/1972 | Shaw .......................... 96/35 |
| 3,904,454 A | 9/1975 | Magdo et al. ................ 156/11 |
| 4,030,967 A | 6/1977 | Ingrey et al. ................ 156/643 |
| 4,135,954 A | 1/1979 | Chang et al. ................ 148/187 |
| 4,180,432 A | 12/1979 | Clark |
| 4,241,165 A | 12/1980 | Hughes et al. |
| 4,243,435 A | 1/1981 | Barile et al. ................. 148/1.5 |
| 4,244,752 A | 1/1981 | Henderson et al. |
| 4,283,249 A | 8/1981 | Ephrath ...................... 156/643 |
| 4,324,611 A | 4/1982 | Vogel et al. |

(Continued)

FOREIGN PATENT DOCUMENTS

EP    0 050 972 A2    5/1982

(Continued)

OTHER PUBLICATIONS

Complaint for Declaratory Relief, filed in *Sandisk Corp.* v. *Micron Tech., Inc.,* Case. No. C-02-2627VRW (N. D. Cal.).

(Continued)

*Primary Examiner*—George A. Goudreau
(74) *Attorney, Agent, or Firm*—Wong, Cabello, Lutsch, Rutherford & Brucculeri, LLP

(57) ABSTRACT

A process for controlling the plasma etch of a silicon dioxide layer at a high etch rate and high selectivity with respect to silicon nitride, particularly in a multilayer structure, by (1) maintaining various portions of the etch chamber at elevated temperatures, and/or (2) using an etch chemistry having a fluorohydrocarbon gas containing at least as many hydrogen atoms as fluorine atoms, preferably $CH_2F_2$ or $CH_3F$.

114 Claims, 3 Drawing Sheets

U.S. PATENT DOCUMENTS

| | | | |
|---|---|---|---|
| 4,350,578 A | 9/1982 | Frieser et al. | 204/192 R |
| 4,352,724 A | 10/1982 | Sugishima et al. | 204/192 |
| 4,368,092 A | 1/1983 | Steinberg et al. | 156/345 |
| 4,371,407 A | 2/1983 | Kurosawa | 148/187 |
| 4,374,698 A | 2/1983 | Sanders et al. | |
| 4,377,438 A | 3/1983 | Moriya et al. | 156/643 |
| 4,401,054 A | 8/1983 | Matsuo et al. | 118/723 |
| 4,439,270 A | 3/1984 | Powell et al. | |
| 4,461,672 A | 7/1984 | Musser | 156/644 |
| 4,492,620 A | 1/1985 | Matsuo et al. | 204/192 R |
| 4,511,430 A | 4/1985 | Chen et al. | 156/643 |
| 4,522,681 A | 6/1985 | Gorowitz et al. | 156/643 |
| 4,568,410 A | 2/1986 | Thornquist | |
| 4,581,101 A | 4/1986 | Senoue et al. | |
| 4,671,849 A | 6/1987 | Chen et al. | 156/643 |
| 4,675,073 A | 6/1987 | Douglas | 156/643 |
| 4,696,097 A | 9/1987 | McLaughlin et al. | 437/193 |
| 4,711,698 A | 12/1987 | Douglas | 156/643 |
| 4,734,152 A | 3/1988 | Geis et al. | |
| 4,734,157 A | 3/1988 | Carbaugh et al. | |
| 4,778,561 A | 10/1988 | Ghanbari | 156/643 |
| 4,789,560 A | 12/1988 | Yen | |
| 4,807,016 A | 2/1989 | Douglas | 357/67 |
| 4,832,789 A | 5/1989 | Cochran et al. | 156/644 |
| 4,837,176 A | 6/1989 | Zdebel et al. | 437/31 |
| 4,870,245 A | 9/1989 | Price et al. | |
| 4,877,641 A | 10/1989 | Dory | |
| 4,883,767 A | 11/1989 | Gray et al. | 437/41 |
| 4,892,753 A | 1/1990 | Wang et al. | |
| 4,912,061 A | 3/1990 | Nasr | 437/44 |
| 4,918,031 A | 4/1990 | Flamm et al. | 437/225 |
| 4,948,458 A | 8/1990 | Ogle | 156/643 |
| 4,952,274 A | 8/1990 | Abraham | 156/643 |
| 4,962,058 A | 10/1990 | Cronin et al. | 437/187 |
| 4,966,870 A | 10/1990 | Barber et al. | 437/228 |
| 4,971,655 A | 11/1990 | Stefano et al. | |
| 4,978,420 A | 12/1990 | Bach | |
| 5,013,398 A | 5/1991 | Long et al. | |
| 5,013,692 A | 5/1991 | Ide et al. | |
| 5,021,121 A | 6/1991 | Groechel et al. | |
| 5,040,046 A | 8/1991 | Chhabra et al. | |
| 5,043,790 A | 8/1991 | Butler | |
| 5,091,326 A | 2/1992 | Haskell | 437/43 |
| 5,093,277 A | 3/1992 | Arima et al. | 437/69 |
| 5,136,124 A | 8/1992 | Cronin et al. | 174/261 |
| 5,169,802 A | 12/1992 | Yeh | 437/195 |
| 5,176,790 A | 1/1993 | Arleo et al. | 156/643 |
| 5,189,506 A | 2/1993 | Cronin et al. | 257/752 |
| 5,200,358 A | 4/1993 | Bollinger et al. | 437/180 |
| 5,242,538 A | 9/1993 | Hamrah et al. | |
| 5,244,837 A | 9/1993 | Dennison | 437/195 |
| 5,269,879 A | 12/1993 | Rhoades et al. | 156/643 |
| 5,286,344 A * | 2/1994 | Blalock et al. | 156/657 |
| 5,286,667 A | 2/1994 | Lin et al. | |
| 5,290,726 A | 3/1994 | Kim | 437/52 |
| 5,296,095 A | 3/1994 | Nabeshima et al. | 156/662 |
| 5,298,463 A | 3/1994 | Sandhu et al. | 437/192 |
| 5,302,236 A | 4/1994 | Tahara et al. | 156/643 |
| 5,312,518 A | 5/1994 | Kadomura | 156/662 |
| 5,316,616 A | 5/1994 | Nakamura et al. | |
| 5,321,211 A | 6/1994 | Haslam et al. | 174/262 |
| 5,338,398 A | 8/1994 | Szwejkowski et al. | |
| 5,338,700 A | 8/1994 | Dennison et al. | 437/60 |
| 5,354,711 A | 10/1994 | Heitzmann et al. | 437/182 |
| 5,364,804 A | 11/1994 | Ho et al. | |
| 5,366,590 A | 11/1994 | Kadomura | 156/662 |
| 5,372,969 A | 12/1994 | Moslehi | 437/195 |
| 5,376,233 A | 12/1994 | Man | |
| 5,423,945 A | 6/1995 | Marks et al. | |
| 5,429,710 A | 7/1995 | Akiba et al. | 216/17 |
| 5,439,846 A | 8/1995 | Nguyen et al. | 437/187 |
| 5,451,290 A | 9/1995 | Salfelder | |
| 5,468,342 A | 11/1995 | Nulty et al. | 156/643.1 |
| 5,470,768 A | 11/1995 | Yanai et al. | |
| 5,477,975 A | 12/1995 | Rice et al. | |
| 5,503,901 A | 4/1996 | Sakai et al. | 428/161 |
| 5,554,557 A | 9/1996 | Koh | 437/52 |
| 5,556,501 A | 9/1996 | Collins et al. | |
| 5,562,801 A | 10/1996 | Nulty | 156/643.1 |
| 5,731,242 A | 3/1998 | Parat et al. | 438/586 |
| 5,772,832 A | 6/1998 | Collins et al. | 156/345 |
| 5,880,036 A | 3/1999 | Becker et al. | 438/740 |
| 5,880,037 A | 3/1999 | Arleo | 438/740 |
| 5,888,414 A | 3/1999 | Collins et al. | 216/68 |
| 6,015,760 A * | 1/2000 | Becker et al. | 438/714 |
| 6,171,974 B1 | 1/2001 | Marks et al. | 438/740 |
| 6,184,150 B1 | 2/2001 | Yang et al. | 438/740 |
| 6,194,325 B1 | 2/2001 | Yang et al. | 438/740 |
| 6,287,978 B1 * | 9/2001 | Becker et al. | 438/723 |
| 6,399,514 B1 | 6/2002 | Marks et al. | 438/729 |

FOREIGN PATENT DOCUMENTS

| | | |
|---|---|---|
| EP | 0 265 584 A2 | 5/1988 |
| EP | 0 520 519 A1 | 12/1992 |
| EP | 0 552 490 A1 | 7/1993 |
| EP | 0 644 584 A1 | 3/1995 |
| EP | 0 651 434 A2 | 5/1995 |
| EP | 0 777 267 | 10/1996 |
| GB | 2 175 542 A | 12/1986 |
| JP | 55009464 | 1/1980 |
| JP | 57210631 | 12/1982 |
| JP | 58-53833 | 3/1983 |
| JP | 58053833 | 3/1983 |
| JP | 60111474 | 6/1985 |
| JP | 60143633 | 7/1985 |
| JP | 61-224423 | 10/1986 |
| JP | 01-15930 | 1/1989 |
| JP | 01-015930 | 1/1989 |
| JP | 2-62038 | 3/1990 |
| JP | 2062038 | 3/1990 |
| JP | 02198634 | 8/1990 |
| JP | 03262503 | 11/1991 |
| JP | 4-180222 | 6/1992 |
| JP | 0418022 | 6/1992 |
| JP | 04180222 | 6/1992 |
| JP | 4-298032 | 10/1992 |
| JP | 04298032 | 10/1992 |

OTHER PUBLICATIONS

Watanabe, S., "Plasma Cleaning by Use of Hollow-Cathode Discharge in a $CHF_3$-$SiO_2$ Dry-Etching System", *Japanese J. Appl. Physics* 1992, 31; 1491-1498.

Yasuaki Nagahiro, "Self-Aligned Contact Development Activity Increases Aimed for Large Scale Manufacturing Around 0.25 Mm Era Problem of Etching Technology: Improvement of $Si_3N_4$ Selectivity Ratio", *Nikkei Microdevices*, Feb. 1995, pp. 54-61.

Gottscho, R.A., "Recent Developments in Plasma Processing", AT&T Bell Laboratories, 1994, *American Vacuum Society Symposium*, p. 120.

Nulty, J.E.; Trammel, P.S., "Self-Aligned Contact (SAC) Dry Etch Process of 0.5m SRAM Technology", *1994 American Vacuum Society Symposium*, p. 120.

"The Correlation Between Selective Oxide Etching and Thermodynamic Prediction", S.C. McNevin, AT&T Bell Laboratories, *1994 American Vacuum Society Symposium*, p. 120.

Horiike, Y.; Kubota K.; Fukazawa T., "High Rate and Highly Selective $SiO_2$ Etching Employing Inductively Coupled Plasma", Tokyo University, *1994 American Vacuum Society Symposium*, p. 120.

Yin, G.Z.; Ben-Dor, M.; Chang, M.S.; Yep, T.O. "High-Selectivity Plasma Etching of Silicon Dioxide on Single-Wafer Etchers", *Journal of Vacuum Science & Technology A* 1989, A7(3); 691-695.

Bariya, A.J.; Shan, H.; Frank, C.W.; Self, S.A.; McVittie, J.P., "The Etching of $CHF_3$ Plasma Polymer in Fluorine-Containing Discharges", *Journal of Vacuum Science and Technology B* 1991, 9(1); 1-7.

Machida, K.; Oikawa, H., "$SiO_2$ Planarization Technology with Biasing and Electron Cyclotron Resonance Plasma Deposition for Submicron Interconnections", *Journal of Vacuum Science and Technology B* 1986, 4; 818-821.

Anonymous, "Selective Reactive Ion Etch for Silicon Oxide Over Silicon Nitride", *Research Disclosure* 1989, 301; 340.

Moss, S.J., et al. Eds. "Plasma Etching", in *The Chemistry of the Semiconductor Industry*, New York: Blackie & Son Ltd., 1987, pp. 374-378.

D'Agostino, R., "Summary Abstract: Mechanisms of Polymerization in Discharges of Fluorocarbons", *Journal of Vacuum Science and Technology A* 1985, 3 (6); 2627-2628.

Riley, P.E.; Hanson, D.A., "Comparison of Etch Rates of Silicon Nitride, Silicon Dioxide, and Polycrystalline Silicon Upon $O_2$ Dilution of $CF_4$ Plasmas", *Journal of Vacuum Science and Technology B* 1989, 7(6); 1352-1356.

Gottlieb, S.; Oehrlein, G.S.; Lee, Y.H., "Reactive Ion Etching Related Si Surface Residues and Subsurface Damage: Their Relationship to Fundamental Etching Mechanisms", *Journal of Vacuum Science and Technology A* 1987, 5 (4); 1585-1594.

Gilboa, H.; Hata, W.; O'Donnell, K., "Nondestructive Characterization of RIE Induced Radiation Damage Using Surface Accoustic Waves", *Mat. Res. Soc. Symp. Proc.* 1985, 38 511-517.

Truesdale, B.A.; Smolinsky, G.; Mayer, T.M., "The Effect of Added Acetylene on the RF Discharge Chemistry of $C_2F_6$, A Mechanistic Model for Fluorocarbon Plasmas", *J. Applied Physics* 1980, 51(5); 2909-2913.

Norström, H.; Buchtam R.; Runovc, F.; Wiklund, P., "RIE of $SiO_2$ in Doped and Undoped Fluorocarbon Plasmas", *Vacuum* 1982, 32(12); 737-745.

Coburn, J.W., "Increasing the Etch Ratio of$SiO_2$/Si in Fluorocarbon Plasma Etching", *IBM Technical Disclosure, Bulletin* 1977, 19 (10); 3854.

Arends, H.T.; DeVries, C.A.M.; van Roosmalen, A.J.; Puylaert, G.C.C., "Mass Spectrometry and Reactive Ion Etching of Silicon Nitride ($Si_3N_4$), Silicon Dioxide, and Silicon in Freon on Various Electrode Materials", in *Symposium Proceedings—International Symposium of Plasma Chemistry*, vol. 3, 7th Ed.; Eindrove Publishers: 1985; 1007-1012.

Clarke, P.E.; Field, D.; Hydes, A.J.; Klemper, D.F.; Seakins, M.J., "Mass Spectrometric Studies of Plasma Etching of Silicon Nitride", *Journal of Vacuum Science and Technology, B*, vol. 3, No. 6 (Nov., 1985), pp. 1614-1619.

Dalton, T.J.; Arnold, J.C.; Swain, H.H.; Swan, S.; Corliss, D., "Microtrench Formation in Polysilicon Plasma Etching Over Thin Gate Oxide", *Journal of the Electrochemical Society*, vol. 140, No. 8 (Aug., 1993), pp. 2395-2401.

Hikosaka, Y.; Sugai, H., "Radical Kinetics in a Fluorocarbon Etching Plasma", *Japanese Applied Physics*, vol. 32, No. 6 (Jun., 1993), pp. 3040-3044.

Li, Y.X.; Laros, M.; Sarro, P.M.; French, P.J.; Wolffenbuttel, R.F., "Plasma Etching of Polysilicon/Nitride/Polysilicon Sandwich Structure for Sensor Applications", *Microelectronic Engineering*, vol. 21 (1993), pp. 341-344.

Lindstrom, J.L.; Oehrlein, G.S.; Lanford, W.A., "RIE of Silicon Nitride Deposited by Different Methods in $CF_4/H_2$ Plasmas", *Journal of the Electrochemical Society*, vol. 139, No. 1 (Jan., 1992), pp. 317-320.

Samukawa, S., "Time-Modulated ECR Plasma Discharge for Controlling Polymerization in $SiO_2$ Etching", *Jpn. Journal of Applied Physics*, vol. 32, part 1, No. 12B (Dec., 1993), pp. 6080-6087.

Sato, M.; Takehara, D.; Uda, K.; Sakiyama, K.; Hara, T., "Suppression of Microloading Effect by Low-Temperature $SiO_2$ Etching", *Jpn. Journal of Applied Physics*, vol. 31, No. 12B (Dec., 1992), pp. 4370-4375.

Misaka, A.; Harafuji, K.; Kubota. M.; Nomura, N., "Novel Surface Reaction Model in Dry-Etching Process Stimulator", *Jpn. Journal of Applied Physics*, vol. 31, Pt. 1, No. 12B (Dec., 1992), pp. 4363-4369.

Gottlieb, S.; Oehrlein, G.S.; Williams, H.L., "Silicon Etching Mechanisms in a $CF_4/H_2$ Glow Discharge", *Journal of Applied Physics*, vol. 62, No. 2 (Jul., 1987), pp. 662-672.

Ohiwa, T.; Horioka, K.; Arikado, T.; Hasegawa, I.; Okano, H., "$SiO_2$ Tapered Etching Employing Magnetron Discharge of Fluorocarbon Gas", *Jpn. Journal of Applied Physics.*, vol. 31, Pt. 1, No. 2A (1992), pp. 405-410.

Bondur, et al., "Gas Mixing to Prevent Polymer Formation During Reactive Ion Etching", *IBM Technical Disclosure Bulletin*, vol. 21, No. 10 (Mar., 1979), p. 4016.

Kaga, T., et al., "Crown-Shaped Capacitor Cell for 1.5 V Operation 65 Mb DRAM's", *IEEE Transactions on Electronic Devices*, vol. 38, No. 2 (1991), pp. 225-261.

Kure, T., et al., "VLSI Device Fabrication Using Unique, Highly-Selective $Si_3N_4$ Dry Etching", Proceedings of the International Electron Devices Meeting (IEDM), 1983, pp. 757-759.

Riley, P.E.; Young, K.K.; Liu, C.C., "Formation of Contacts in a Planarized $SiO_2/Si_3N_4/SiO_2$ Dielectric Structure", *Journal of the Electrochemical Society*, vol. 139, No. 9 (Sep., 1992), pp. 2613-2616.

Becker, D.S.; Blalock, G., "A Method of Obtaining a High Oxide to Nitride Selectivity in an MERIE Reactor", 1993 Symposium of the Dielectric Science and Technology and Electronics Divisions of the Electrochemical Society, vol. 93-21 (May 19, 1993), pp. 178-189.

Armacost, M.; Marks, J.; C.I. Yang, "Selective Oxide: Nitride Dry Etching in a High Density Plasma Reactor", Symposium of Dielectric Science and Technology and Electronic Divisions of the Electrochemical Society, vol. 93-21, (May 19, 1993), pp. 190-200.

Kuesters, K.H.; Muekhoff, H.M.; Enders, G.; Mohr, E.G.; Mueller, W., "Self-Aligned Bitline Contact for 4-Mbit DRAM", Extended Abstracts, The Electrochemical Society, vol. 87-1 (1987), pp. 640-649.

Kenney, et al., "A Buried-Plate Trench Cell for a 64-Mb DRAM", 1992 Symposium of VLSI, IEEE.

Kusters, K.H.; Enders, G.; Meyberg, W.; Benzinger, H.; Hasler, B.; Higelin, G.; Rohl, S.; Muhlhoff, H.M.; Muller, W., "A High Density 4 Mbit DRAM Process Using a Fully Overlapping Bitline Contact (FoBIC) Trench Cell", *1987 Symposium on VLSI Technology Digest of Technical Papers*, pp. 93-94.

Nawata, M.; Kakehi, Y.; Kanai, S.; Kawasaki, Y.; Tsunokuni, K.; Enami, H., "High-Rate and Highly Selective Etching of $SiO_2$ Using Microwave Plasma", *183rd Meeting Electrochemical Society*, Honolulu, Hawaii 1993, pp. 228-234.

Arnold, J.C.; Gray, D.C.; Swain, H.H., "Influence of Reactant Transport on Fluorine RIE of Deep Trenches in Si",

*Journal of Vacuum Science and Technology, B.,* vol. 11, No. 6 (Nov., 1993), pp. 2071-2080.

Barklund, A.M.; Blom, H.O., "Influence of Different Etching Mechanisms on the Angular Dependence of Silicon Nitride Etching", *Journal of Vacuum Science and Technology, A.,* vol. 11, No. 4 (Jul. 1993), pp. 1226-1229.

Loewenstein, "Temperature Dependence of Silicon Nitride Etching by Atomic Fluorine", *Journal of Applied Physics,* vol. 65, No. 1 (1989), pp. 386-387.

Loewenstein, "Selective Etching of Silicon Nitride Using Remote Plasmas of $CF_4$ and $SF_6$," *Journal Vac. Sci. Technology,* vol. 7, No. 3 (1989), pp. 686-690.

Bondur, J.A.; Crimi, C.F., "Gas Mixing to Prevent Polymer Formation During Reactive Icon Etching", *IBM Technical Disclosure Bulletin,* vol. 21, No. 10 (Mar., 1979).

Complaint for Declaratory Relief, filed in *Sandisk Corp. v. Micron Tech., Inc.,* Case No. C-02-2627VRW (N. D. Cal.).

Vossen, J.L.; Cuomo, J.J., "Glow Discharge Sputter Deposition", in *Thin Film Processes,* Vossen, J.L.; Kern, W., Eds.; Academic Press, New York: 1978; pp. 11-73.

Coburn, J.W.; Kay, E., "Some Chemical Aspects of the Fluorocarbon Plasma Etching of Silicon and Its Compounds", *IBM J. Res. Develop.* 1979, vol. 23(1); 33-41.

Toyoda, H.; Komiya, H.; Itakura, H., "Etching Characteristics of $SiO_2$ in $CHF_3$ Gas Plasma", *J. Electronic Mat.* 1980, vol. 9(3); 569-584.

Flamm, D.L.; Donnelly, V.M., "The Design of Plasma Etchants", *Plasma Chemistry and Plasma Processing* 1981, vol. 1(4); 317-363.

Kusters, K.H.; Sesselmann, W.; Melzner, H.; Friesel, B., "A Self Aligned Contact Process with Improved Surface Planarization", *Journal de Physique* 1988, vol. 49, Colloque C4, Suppl. 9; C4503-C4506.

Chang, E.Y.; van Hove, J.M.; Pande, K.P., "A Selective Dry-Etch Technique for GaAs MESFET Gate Recessing", *IEEE Trans. Electron. Devices* 1988, vol. 35(10); 1580-1584.

Nojiri, K.; Iguchi, E.; Kawamura, K.; Kadota, K., "Microwave Plasma Etching of Silicon Dioxide for Half-Micron ULSIs", In *Extended Abstracts of the 21st Conference on Solid State Devices and Materials,* Tokyo, 1989; pp. 153-156.

Grande, W.J.; Johnson, J.E.; Tang, C.L., "Characterization of Etch Rate and Anisotropy in the Temperature-Controlled Chemically Assisted Ion Beam Etching of GaAs", *J. Vac. Sci. Technol. B,* 1990, vol. 8(5); 1075-1079.

Simko, J.P.; Oehrlein, G.S., "Reactive Ion Etching of Silicon and Silicon Dioxide in $CF_4$ Plasmas Containing $H_2$ or $C_2 F_4$ Additives", *J. Electrochem. Soc.* 1991, vol. 138 (9); 2748-2752.

Marks, J.; Collins, K.; Yang, C.L.; Groechel, D.; Keswick, P.; Cunningham, C.; Carlson, M., "Introduction of a New High Density Plasma Reactor Concept for High Aspect Ratio Oxide Etching", *SPIE* vol. 1803 (1992); pp. 235-247.

Sakai, T.; Hayashi, H.; Abe, J.; Horioka, K.; Okano, H., "Examination of Selective Etching and Etching Damage with Mass-Selected Ion Beam", *1993 Dry Process Symposium;* 193-198.

Preliminary Invalidity Contentions regarding Parent Patent 5,286,344, filed in *Sandisk Corp. v. Micron Tech., Inc.,* Civ. No. CV02-2627CW (N. D. Cal.).

Preliminary Invalidity Contentions regarding Parent Patent 6,015,760, filed in *Sandisk Corp. v. Micron Tech., Inc.,* Civ. No. CV02-2627CW (N. D. Cal.).

Preliminary Invalidity Contentions regarding Parent Patent 6,287,978, filed in *Sandisk Corp. v. Micron Tech., Inc.,* Civ. No. CV02-2627CW (N. D. Cal.).

D. Kenney et al., "A Buried-Plate Trench Cell for a 64-Mb DRAM," 1992 Symposium of VLSI, IEEE, pp. 14-15 (1992).

K.H. Kusters et al., "A High Density 4Mbit DRAM Process Using a Fully Overlapping Bitline Contact (FoBIC) Trench Cell," Corporate Research and Technology, 1987 Symposium on VLSI Technology Digest of Technical Papers, pp. 93-94 (1987).

J.A. Bondur & C.F. Crimi, "Gas Mixing to Prevent Polymer Formation During Reactive Icon Etching," IBM Technical Disclosure Bulletin, vol. 21, No. 10, p. 4016 (Mar. 1979).

Bondur, J.A. & Schwartz, S.M., "Selective Reactive Ion Etching of Silicon Compounds," IBM Tech. Disclosure Bulletin, vol. 21, No. 10, p. 4015 (Mar. 1979).

M. Nawata et al., "High-Rate and Highly Selective Etching of SiO2 Using Microwave Plasma," 183rd Meeting Electrochemical Society, Honolulu, Hawaii, pp. 228-234 (1993).

A.M. Barklund & H.O. Blum, "Influence of Different Etching Mechanisms on the Angular Dependence of Si3N4 Etching," J. Vac. Sci. Technol. A, vol. 11, No. 4, pp. 1226-1229 (Jul. 1993).

J.C. Arnold et al., "Influence of Reactant Transport on Fluorine RIE of Deep Trenches in Si," J. Vac. Sci. Technol. B, vol. 11, No. 6., pp. 2071-2080 (Nov. 1993).

P.E. Clarke et al., "Mass Spectrometric Studies of Plasma Etching of Si3N4," J. Vac. Sci. Technol. B, vol. 3, No. 6, pp. 1614-1619 (Nov. 1985).

T.J. Dalton et al., "Microtrench Formation in Polysilicon Plasma Etching Over Thin Gate Oxide," J. Electrochem. Soc., vol. 140, No. 8, pp. 2395-2401 (Aug. 1993).

A. Mikasa et al., "Novel Surface Reaction Model in Dry-Etching Process Stimulator," Jpn. J. Appl. Phys., vol. 31, Pt. 1, No. 12B, pp. 4363-4369 (Dec. 1992).

Y.X. Li et al., "Plasma Etching of Polysilicon/Nitride/Polysilocon Sandwich Structure for Sensor Applications," Microelectron, Engrg., 21, pp. 341-344 (1993).

Y. Hikosaka & H. Sugai, "Radical Kinetics in a Fluorocarbon Etching Plasma," Jpn. Appl. Phys., vol. 32, No. 6, pp. 3040-3044 (Jun. 1993).

J.L. Lindstrom et al., "Reactive Ion Etching of Silicon Nitride Deposited by Different Methods on CF4/H2 Plasmas," J. Electrochem. Soc., vol. 139, No. 1, pp. 317-320 (Jan. 1992).

K.H. Kuesters et al., "Self-Aligned Bitline Contact for 4 Mbit DRAM," pp. 640-649, 1987 (journal/book unknown).

G.S. Oehrlein & H.L. Williams, "Silicon Etching Mechanisms in a CF4/H2 Glow Discharge," J. Appl. Phys., vol. 62, No. 2, pp. 662-672 (Jul. 1987).

S.C. McNevin, "The Correlation Between Selective Oxide Etching and Thermodynamic Prediction," AT&T Bell Laboratories, 1994 American Vacuum Society Symposium, p. 120.

T. Kure et al., "VLSI Device Fabrication Using Unique, Highly-selective Si3N4 Dry Etching," Proceeding of the International Electron Devices Meeting (IEDM), pp. 757-759 (1983).

D.S. Becker & G. Blalock, "A method of obtaining a high oxide to nitride selectivity in an MERIE Reactor," 1993 Symposium of Dielectric Science and Technology and Electronics Divisions of The Electrochemical Society, vol. 93-21, pp. 178-189 (May 19, 1993).

Anonymous, "Selective Reactive Ion Etch for Silicon Oxide Over Silicon Nitride," Research Disclosure, No. 30159, p. 340 (May 1989).

H.T. Arends et al., "Mass Spectrometry and Reactive Ion Etching of Silicon Nitride ($Si_3N_4$), Silicon Dioxide, and Silicon Freon on Various Electrode Materials," in *Symposium Proceedings—International Symposium of Plasma Chemistry*, vol. 3, 7th Ed.(Eindrove pubs.), pp. 1007-1012 (1985).

M. Armacost et al., "Selective Oxide: Nitride Dry Etching in a High Density Plasma Reactor," Symposium of Dielectric Science and Technology and Electronics Divisions of the Electrochemical Society, vol. 93-21, pp. 190-200 (May 19, 1993).

A.J. Bariya et al., "The Etching of $CHF_3$ Plasma Polymer in Fluorine-Containing Discharges," Journal of Vacuum Science and Technology B, vol. 9, No. 1, pp. 1-7 (1991).

E.Y. Chang et al., "A Selective Dry-Etch Technique for GaAs MESFET Gate Recessing," IEEE Trans. Electron. Devices, vol. 35, No. 10, pp. 1580-1584 (1988).

J. W. Coburn, "Increasing the Etch Ratio of$SiO_2$/Si in Fluorocarbon Plasma Etching", IBM Technical Disclosure Bulletin, vol. 19, No. 10, p. 3854 (1977).

J.W. Coburn & E. Kay, "Some Chemical Aspects of the Fluorocarbon Plasma Etching of Silicon and Its Compounds," IBM J. Res. Develop., vol. 23, No. 1, pp. 33-41 (1979).

Complaint for Declaratory Relief, filed in *Sandisk Corp. v. Micron Tech., Inc.*, Case No. C-02-2627VRW (N. D. Cal. May 31, 2002).

R. D'Agostino, "Summary Abstract: Mechanisms of Polymerization in Discharges of Fluorocarbons," J. Vacuum Sci. & Tech., vol. 3, No. 6, pp. 2627-2628 (1985).

D.L. Flamm & V.M. Donnelly, "The Design of Plasma Etchants," Plasma Chemistry and Plasma Processing, vol. 1, No. 4, pp. 317-363 (1981).

H. Gilboa et al., "Nondestructive Characterization of RIE Induced Radiation Damage Using Surface Accoustic Waves," Mat. Res. Soc. Symp. Proc., vol. 38, pp. 511-517 (1985).

G.S. Oehrlein & Y.H. Lee, "Reactive Ion Etching Related Si Surface Residues and Subsurface Damage: Their Relationship to Fundamental Etching Mechanisms," J. Vacuum Sci. & Tech. A, vol. 5, No. 4, pp. 1585-1594 (1987).

W.J. Grande et al., "Characterization of Etch Rate and Anisotropy in the Temperature-Controlled Chemically Assisted Ion Beam Etching of GaAs," J. Vac. Sci. & Technol. B, vol. 8, No. 5, pp. 1075-1079 (1990).

Y. Horiike et al., "High Rate and Highly Selective $SiO_2$ Etching Employing Inductively Coupled Plasma and Discussion on Reaction Kinetics," Journal Unknown, pp. 801-809 (received Oct. 27, 1994; Accepted Mar. 17, 1995).

Kaga, T. et al., "Crown-Shaped Capacitor Cell for 1.5 V Operation 65 Mb DRAMs," IEEE Transactions on Electronic Devices, vol. 38, No. 2, pp. 255-261 (1991).

K.H. Kusters et al., "A Self Aligned Contact Process with Improved Surface Planarization," Journal de Physique, vol. 49, Colloque C4, Suppl. 9, C4503-06 (1988).

L.M. Loewenstein, "Selective Etching of Silicon Nitride Using Remote Plasmas of $CF_4$ and $SF_6$," J. Vac. Sci. & Tech, vol. 7, No. 3, pp. 686-690 (1989).

L.M. Loewenstein, "Temperature Dependence of Silicon Nitride Etching by Atomic Fluorine," American Institute of Physics, vol. 65, No. 1, pp. 386-387 (1989).

K. Machida & H. Oikawa, "$SiO_2$ Planarization Technology with Biasing and Electron Cyclotron Resonance Plasma Deposition for Submicron Interconnections," J. Vacuum Sci. & Tech. B, vol. 4, pp. 818-821 (1986).

J. Marks et al., "Introduction of a New High Density Plasma Reactor Concept for High Aspect Ratio Oxide Etching," SPIE, vol. 1803, pp. 235-247 (1992).

S.J. Moss et al., eds. "Plasma Etching", in *The Chemistry of the Semiconductor Industry*, New York, Blackie & Son Ltd., Ch. 15, pp. 343-390 (1987).

K. Nojiri et al., "Microwave Plasma Etching of Silicon Dioxide for Half-Micron ULSIs," in *Extended Abstracts of the 21st Conference on Solid State Devices and Materials*, pp. 153-156 (Tokyo 1989).

H. Norström et al., "RIE of $SiO_2$ in Doped and Undoped Fluorocarbon Plasmas," Vacuum, vol. 32, No. 12, pp. 737-745 (1982).

T. Ohiwa et al., "$SiO_2$ Tapered Etching Employing Magnetron Discharge of Fluorocarbon Gas," Jpn. J. App. Physics., vol. 31, Pt. 1, No. 2A, pp. 405-410 (1992).

Preliminary Invalidity Contentions regarding Parent Patent 5,286,344, filed in *Sandisk Corp. v. Micron Tech., Inc.*, Civ. No. CV02-2627CW (N. D. Cal. Dec. 6, 2002).

Preliminary Invalidity Contentions regarding Parent Patent 6,015,760, filed in *Sandisk Corp. v. Micron Tech., Inc.*, Civ. No. CV02-2627CW (N. D. Cal. Nov. 21, 2002).

Preliminary Invalidity Contentions regarding Parent Patent 6,287,978, filed in *Sandisk Corp. v. Micron Tech., Inc.*, Civ. No. CV02-2627CW (N. D. Cal. Dec. 6, 2002).

P.E. Riley & D.A. Hanson, "Comparison of Etch Rates of Silicon Nitride, Silicon Dioxide, and Polycrystalline Silicon Upon $O_2$ Dilution of $CF_4$ Plasmas," J. Vacuum Sci. & Tech. B, vol. 7, No. 6, pp. 1352-1356 (1989).

P.E. Riley et al., "Formation of Contacts in a Planarized $SiO_2/Si_3N_4/SiO_2$ Dielectric Structure," J. Electrochemical Soc., vol. 139, No. 9, pp. 2613-2616 (Sep. 1992).

T. Sakai et al., "Examination of Selective Etching and Etching Damage with Mass-Selected Ion Beam," 1993 Dry Process Symposium, pp. 193-198 (1993).

S. Samukawa, "Time-Modulated Electron Cyclotron Resonance Plasma Discharge for Controlling Polymerization in $SiO_2$ Etching," Jpn. J. Applied Phys., vol. 32, Pt. 1, No. 12B, pp. 6080-6087 (Dec. 1993).

M. Sato et al., "Suppression of Microloading Effect by Low-Temperature $SiO_2$ Etching," Jpn. J. Applied Phys., vol. 31, No. 12B, pp. 4370-4375 (Dec. 1992).

J. P. Simko & G.S. Oehrlein, "Reactive Ion Etching of Silicon and Silicon Dioxide in $CF_4$ Plasmas Containing $H_2$ or $C_2F_4$ Additives," J. Electrochem. Soc., vol. 138, No. 9, pp. 2748-2752 (1991).

H. Toyoda et al., "Etching Characteristics of $SiO_2$ in $CHF_3$ Gas Plasma," J. Electronic Mat., vol. 9, No. 3, pp. 569-584 (1980).

E.A. Truesdale et al., "The Effect of Added Acetylene on the RF Discharge Chemistry of $C_2F_6$, A Mechanistic Model for Fluorocarbon Plasmas," J. Applied Physics, vol. 51, No. 5, pp. 2909-2913 (1980).

J.L. Vossen & J.J. Cuomo, "Glow Discharge Sputter Deposition," in *Thin Film Processes*, J.L. Vossen & W. Kern, eds., Academic Press, New York, Ch. 11-1, pp. 11-73 (1978).

S. Watanabe, "Plasma Cleaning by Use of Hollow-Cathode Discharge in a $CHF_3-SiO_2$ Dry-Etching System," Jpn., J. Appl. Physics, vol. 31, pp. 1491-1498 (1992).

Y. Nagahiro, "Self Aligned Contact Development Activity Increases Aimed for Large Scale Manufacturing Around 0.25 Mm Era Problem of Etching Technology: Improvement of Si3N4 Selectivity Ratio," Nikkei Microdevices, LSI Update, pp. 54-61 (Feb. 1995).

G.Z. Yin et al., "High-Selectivity Plasma Etching of Silicon Dioxide on Single-Wafer Etchers," J. Vacuum Sc. & Tech. A, vol. 7, No. 3, pp. 691-695 (1989).

Anonymous, "New Insight into Oxide Etch Mecahnisms-Substrate Heating Beneficial," *Semiconductor International*, p. 88 (Jun. 1997).

K. Harashima et al., "Selective Oxide Etching to Silicon Nitride," 1994 Dry Process Symposium, pp. 247-251 (Tokyo Nov. 10-11, 1994).

T. Ono et al., "Mechanism for CF Polymer Film Deposition through Deep Si02 Holes in Electron Cyclotron Resonance Plasma, " Jpn. J. Appl. Phy., vol. 35, pp. 2468-2471 (Apr. 1996).

W. Tsai, "High Selectivity Plasma Etching of Silicon Dioxide with a Dual Frequency 27/2 MHz Capacitive Radio Frequency Discharge," J. Vac. Sci. Technol. B, vol. 14, No. 5, pp. 3276-3282 (Sep./Oct. 1996).

S. Sekiyama et al., "The Investigation for Introduction of SAC Etching Technique to Mass Productive DRAM Process," Oki Electric Industry Co.& Mizyazaki Oki Electric Co., IEEE 0-7803-3752-2, pp. F-17 to F-20 (1997).

H. Hayashi et al., "Characterization of Highly Selective Si02/Si3N4 Etching of High-Aspect Ratio Holes," Jpn. J. Appl. Phys., vol. 35, pp. 2488-2493 (1996).

H. Kazumi et al., "Analysis of Plasma Chemical Reactions in Dry Etching of Silicon Dioxide," Jpn. J. Appl. Phys., vol. 34, Pt. 1, No. 4B, pp. 2125-2131 (Apr. 1995).

M. A. Jaso et al., "Simultaneous BPSG Planarization and Contact Stud Formation in a .25 um DRAM Process," 1996 VMIC Conference, pp. 407-412 (Jun. 18-20, 1996).

Y. Ishigaki et al., "Low Parasitic Resistance Technologies with NES-SAC and SWT-CDV Process for Low Supply Voltage, High Speed BiCMOS SRAMS," 1994 Symposium on VLSI Technology Digest of Technical Papers, p. 99-100 (1994).

J.H. Kim et al., "The Effects of CH3F Addition to Carbon-rich Chemistry on Nitride Barrier SAC Etching for 1G DRAM and Beyond," 43$^{rd}$ National AVS Symposium, pg. 133 (Oct. 14-18, 1996) (Abstract).

J. Gambino et al., "A Si3N4 Etch Stop Process for Borderless Contacts in 0.25 um Devices," 1995 VMIC Conference, pp. 558-564 (Jun. 27-29, 1995).

M. Gallagher et al., "A Novel, Borderless Metal-to-Diffusion Contact Technique," 1995 IEEE/SEMI Advanced Semiconductor Manufacturing Conference, pp. 13-15 (Nov. 13-15, 1995).

A. Perera et al., "Scaling Self-aligned Contacts for .25 um and Below," Proceedings of SPIE: Microelectronic Device Technology, vol. 3212, pp. 171-175 (Oct. 1-2, 1997).

Y. Chinzei et al., "Si02 Etching Employing Inductively Coupled Plasma with Hot Inner Wall," Jpn. J. Appl. Phys., vol. 35, Pt. 1, No. 4B, pp. 2472-2476 (Apr. 1996).

J-H Kim et al., "Thin Nitride Barrier Self-Aligned Contact (TNBSAC) Oxide Etching in a High Density Inductively Coupled Plasma Using C4F8/CH3F/Ar Chemistry," Electrochemical Society Proceedings, vol. 98-4, pp. 137-145 (1998).

T. Akimoto et al., "Oxide Etching Using Surface Wave Coupled Plasma," Jpn. J. Appl. Phys., vol. 33, pp. 7037-7041 (Dec. 1994).

T. Tsukada et al., "Electrode Temperature Effect in Narrow-Gap Reactive Ion Etching," Jpn. J. Appl. Phys., vol. 32, Pt. 1, No. 10, pp. 4850-4853 (1993).

M. Yamanaka et al., "Highly Selective Si02 Etching with an Inductively Coupled Plasma Source Using a Multispiral Coil," Jpn. J. Applied Physics, vol. 37, pp. 2343-2348 (Apr. 1998).

*Motorola, Inc.* v. *Micron Technology, Inc.*, Reply and Amended Counterclaim in Reply to Counterclaim and Demand for Jury Trial, Case No. A04 CA 007 LY (W.D. Tex. Apr. 27, 2004).

H. Enomoto & T. Tokunaga, "Analysis of Mechanisms of Highly Selective Oxide Etching," 1994 Dry Process Symposium, pp. 241-246 (Nov. 10-11, 1994, Tokyo).

Y. Gotoh & T. Kure, "Analysis of Polymer Formation During Si02 Microwave Plasma Etching," 1994 Dry Process Symposium, pp. 211-216 (Nov. 10-11, 1994, Tokyo).

Y. Hikosaka et al., "Inductively-Coupled Plasma Etching in a Pulsed Mode," 1994 Dry Process Symposium, pp. 199-204 (Nov. 10-11, 1994, Tokyo).

K. Kurihara et al., "Measurement of Energy Distribution of Ion Species Through a High-Aspect-Ratio Hole in a C4F8 Plasma," 1994 Dry Process Symposium, pp. 217-221 (Nov. 10-11, 1994, Tokyo).

Shin Arai, "Polymer Deposition Control in SiO2 Etching by Substrate Temperature Manipulation," 1994 Dry Process Symposium, pp. 223-227 (Nov. 10-11, 1994, Tokyo).

Reply and Counterclaims in Reply to Counterclaim and Demand for Jury Trial, Motorola, Inc. v. Micron Technology, Inc., Civ. No. 04 CA 007 LY (Apr. 7, 2004) (W.D. Tex.).

J.L. Yeh et al., "Reverse Pillar—A Self-Aligned and Self-Planarised Metallisation Scheme for Sub-Micron Technology," Vacuum: Technology, Applications & Ion Physics, vol. 38, Nos. 8-10, pp. 817-821 (1988).

* cited by examiner

METHOD FOR ENHANCING SILICON DIOXIDE TO SILICON NITRIDE SELECTIVITY

CROSS-REFERENCE TO RELATED APPLICATIONS

This is a continuation application of U.S. application Ser. No. 09/344,277, filed Jun. 30, 1999, which issued as U.S. Pat. No. 6,287,978 on Sep. 11, 2001; which was a continuation of U.S. applicant Ser. No. 08/905,891, filed Aug. 4, 1997, which issued as U.S. Pat. No. 6,015,760 on Jan. 18, 2000; which was a continuation of U.S. application Ser. No. 08/152,755, filed Nov. 15, 1993, which issued as U.S. Pat. No. 5,880,036 on Mar. 9, 1999; which was a continuation-in-part of U.S. application Ser. No. 07/898,505, filed Jun. 15, 1992, which issued as U.S. Pat. No. 5,286,344 on Feb. 15, 1994.

FIELD OF THE INVENTION

This invention relates to semiconductor manufacturing, and more particularly to a process for selectively etching a silicon dioxide layer disposed on a silicon nitride layer, useful when etching features have submicron geometries.

BACKGROUND OF THE INVENTION

With geometries shrinking, it is becoming more difficult to align small contacts in between closely spaced wordlines or other conductive structures. Therefore, an etch is needed which would etch an oxide layer and stop on the underlying nitride layer. The highly selective etch should also display consistency for manufacturing purposes.

Current manufacturing processes of multilayer structures typically involve patterned etching of areas of the semiconductor surface which are not covered by a pattern of protective photoresist material. These etching techniques use liquid or wet etching materials, or dry etching with halogens or halogen-containing compounds.

Etching of the multilayer structures can also be conducted in a gas phase using known techniques, such as plasma etching, ion beam etching, and reactive ion etching. The use of gas plasma technology provides substantially anisotropic etching using gaseous ions, typically generated by a radio frequency (RF) discharge In gas plasma etching the requisite portion of the surface to be etched is removed by a chemical reaction between the gaseous ions and the subject surface. In the anisotropic process, etching takes place primarily in the vertical direction so that feature widths substantially match the photoresist pattern widths. Anisotropic etching is utilized when feature sizing after etching must be maintained within specific limits so as not to violate alignment tolerances or design rules.

Higher density multilayer structures such as 64 and 256 Megabit DRAM require an additional amount of alignment tolerance which can not be addressed by current photolithographic means. In such applications, an etch stop technology could be used to supply the desired tolerance.

In an etch "stop" system, an etch "stop" layer is deposited on underlying structures. The superjacent layer is disposed over the underlying etch "stop" layer through which the desired patterns will be defined. The etch "stop" layer will then be used to terminate the etch process once the superjacent layer has been completely removed in the desired pattern locations. Thus, the etch "stop" layer acts to protect structures underlying the etch "stop" layer from damage due to the dry chemical etch of the superjacent layer.

The preferred etch "stop" material is silicon nitride because its properties are well known, and it is currently used for semiconductor fabrication. The preferred superjacent layer is silicon dioxide, or other oxide such as, BPSG.

The etch stop process must have three basic properties, namely, (1) a high etch rate for the superjacent layer which (2) produces substantially vertical sidewalls, and (3) has a high selectivity of the superjacent layer being etched down to the etch "stop" layer.

A problem of profile control occurs with respect to etching of a multilayer structure having a silicon dioxide layer disposed on an underlying silicon nitride layer. Profile control using pure chemical etching (e.g., using hydrofluoric acid) tends to produce structures that do not have vertical sidewalls.

Dry etch processing usually produces a more vertical profile because of the ion bombardment aspect of the process. However, the dry etch process can produce a contact wall that slopes out from the bottom, rather than at an angle of 90°, if the wrong mix of process parameters are used. These parameters can include, but are not limited to; fluorocarbon, RF power, and pressure.

The same ion bombardment aspect of the dry etch process used to produce straight sidewalls has a very negative effect on oxide to nitride selectivity. High energy ions needed to etch both oxide and nitride do so by disassociating a chemical bond at the oxide and/or nitride surface. However, the disassociation energy needed for nitride is less than that required for oxide.

Hence, $CH_2F_2$ is added to offset the disassociation properties of nitride as compared to oxide. The $CH_2F_2$ produces a polymer deposition an the nitride surface that acts to passivate the nitride surface and thereby reduce the dry etch removal rate. However, the silicon dioxide etch rate is sustained at a much higher rate than that of silicon nitride.

Current etch process technology for etching an $SiO_2$ layer on an underlying $Si_3N_4$ layer using a dry etcher, such as an RIE or MRIE etcher, cannot produce $SiO_2$-to-$Si_3N_4$ selectivities above 5–6:1 with adequate profile and $SiO_2$ etch rate characteristics.

Almost all of the current etch processes which involve high selective etches, rely on cooler temperatures to obtain those selectivities. See, for example, "Temperature Dependence of Silicon Nitride Etching by Atomic Fluorine," and "Selective Etching of Silicon Nitride Using Remote Plasmas of $CF_4$ and $SF_6$," both by Lee M. Loewenstein. The latter reference uses an Arrhenius plot having a negative slope to illustrate that the nitride etch rate increases as a function of substrate temperature.

Therefore, a need exists for a process of etching a $SiO_2$ layer on an underlying $Si_3N_4$ layer, at a high $SiO_2$ etch rate. Furthermore, there exists a need for an etch at a high selectivity of $SiO_2$ with respect to the underlying $Si_3N_4$, to form an etched multilayer structure at a controlled predetermined profile in which the resulting sidewalls are substantially normal to the substrate.

SUMMARY OF THE INVENTION

The present invention provides unexpected and very key improvements over the current etch processes. The present invention teaches away from current thought, by using increased temperatures to achieve increased selectivity. In addition to improved selectivity, the higher temperatures help reduce the polymer build-up inside the chamber.

The process of the present invention meets the above-described existing needs by forming an etched multilayer structure, in which the sidewalls of the $SiO_2$ layer are substantially normal to the substrate, at a high $SiO_2$ etch rate, and at a high selectivity of $SiO_2$ with respect to the underlying $Si_3N_4$. This is accomplished by heating various portions of the etch chamber while employing a process for etching the $SiO_2$ layer down to the $Si_3N_4$ stop layer.

BRIEF DESCRIPTION OF THE DRAWINGS

The present invention will be better understood from reading the following description of nonlimitative embodiments, with reference to the attached drawings, wherein below.

DETAILED DESCRIPTION OF A PREFERRED EMBODIMENT

The inventive process herein is directed towards anisotropically etching a multilayer structure comprising a silicon dioxide outer layer on an underlying silicon nitride "stop" layer.

Figure 1:
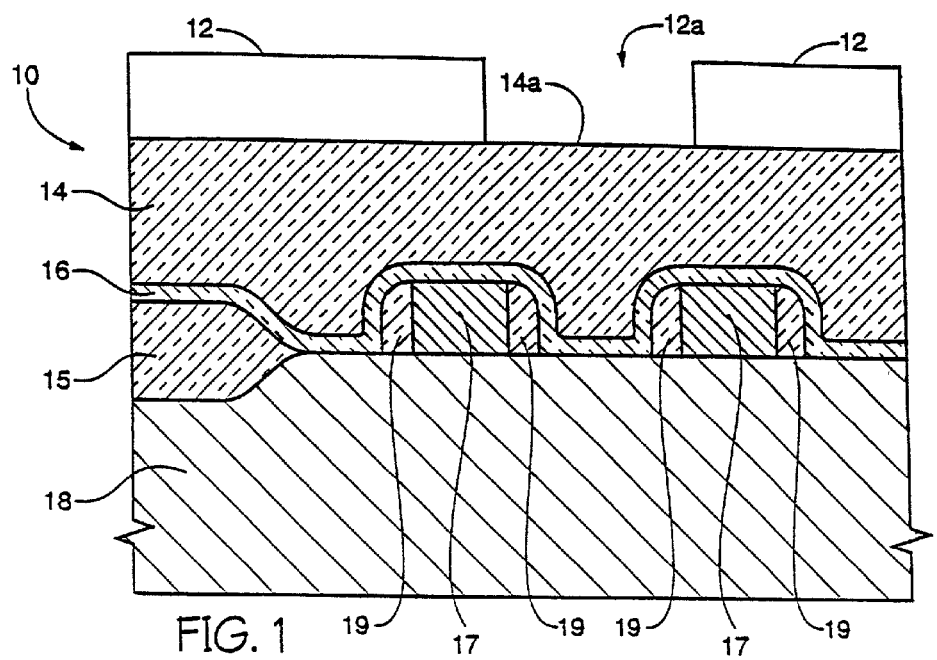
FIG. 1 is a schematic cross-section of a multilayer structure having a silicon dioxide layer disposed on a silicon nitride "etch" stop layer, prior to etching with the fluorinated chemical etchant system of the present invention.

Referring to FIG. 1, a multilayer structure, which is formed by conventional techniques, is depicted. It will serve as a representative example. The multilayer structure of FIG. 1, generally designated as 10, is shown prior to etching.

The multilayer structure 10 comprises a plurality of structural layers which are sequentially disposed on an underlying silicon structure or wafer 18. Multilayer structure 10 comprises a plurality of structural layers including a layer 14 having a major outer surface 14a. Structural layer 14 is fabricated of $SiO_2$.

Generally, an undoped oxide 15, referred to as a field oxide or gate oxide, is usually grown in a furnace. Doped oxide includes BPSG, PSG, etc. which are generally deposited on the silicon wafer with a dopant gas (es) during a deposition process.

The outer structural layer 14 is deposited onto an adjacent intermediate structural layer 16. Layer 16 includes sidewalls and is fabricated of an etch "stop" layer of silicon nitride.

Also shown in FIG. 1, is a chemical etchant protective patterned layer 12 which comprises a photoresist layer having a predetermined arrangement of openings 12a for forming a predetermined pattern in multilayer structure 10. Typically, this is accomplished using a semiconductor photomask, and known conventional etch mask patterning techniques.

The etch "stop" layer 16 is disposed on the field oxide 15, silicon substrate 18, and onto a plurality of polysilicon lines 17 located adjacent to their respective sidewalls spacer elements 19.

Figure 2:
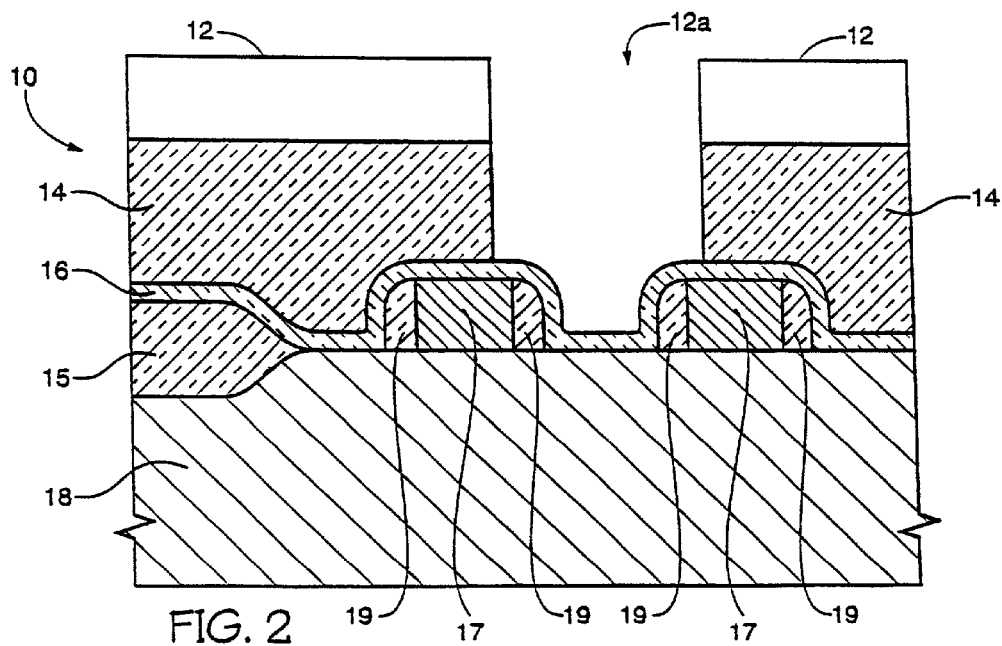
FIG. 2 is a schematic cross-section of the multilayer structure of FIG. 1, after the etch step according to the process of the present invention.

As seen in FIG. 2, the preferred manner of etching of the structural $SiO_2$ layer 14 down to etch "stop" layer 16 is by plasma etch. The gas plasma etch technique employed herein typically has an etching area in a plasma and-is generated under vacuum within the confines of an RF discharge unit.

The preferred plasma etch technique employed herein may include the use of ECR (Electron Cyclotron Resonance), RIE, MIE, MERIE, PE reactive ion, point plasma etching, magnetically confined helicon and helical resonator, PE, or magnetron PE. In plasma dry etchers, typically the upper electrode is powered while the lower electrode is grounded.

In RIE (Reactive Ion Etchers), the lower electrode is powered while the upper electrode is grounded. In triode dry etchers, the upper and lower electrodes can be powered as well as the sidewall. In MERIE (magnetically enhanced reactive ion etch) magnets are used to increase the ion density of the plasma. In ECR (Electron Cyclotron Resonance), the plasma is generated upstream from the main reaction chamber. This produces a low ion energy to reduce damage to the wafer.

A semiconductor device is disposed in the desired etcher, within an etching area, and is etched with a fluorinated chemical etchant system to form a predetermined pattern therein. The fluorinated chemical etchant system comprises a chemical etchant composition, such as, for example, $CHF_3$—$CF_4$—Ar, and a $CH_2F_2$ additive material. The fluorinated chemical etchant system is in a substantially gas phase during the etching of the multilayer structure 10.

The exposed $SiO_2$ layer 14 is selectively etched at a relatively high etch rate down to the $Si_3N_4$ etch "stop" layer 16 by removing predetermined portions of the $SiO_2$ layer 14 by chemically enhanced ionic bombardment. Some areas of the wafer still had $SiO_2$ available for etching, while other areas of the wafer had already reached the nitride layer 16 where the etching process effectively stops because of polymer formation on the nitride surface. In this way, the etching process can provide for the formation of sidewalls in etched layers which have a substantially vertical profile.

The etching system employed in developing the process of this invention was the Applied Materials Precision 5000, a single wafer plasma etching apparatus manufactured by Applied Materials of Santa Clara, Calif. This apparatus comprises a mobile, double cassette platform, a transport chamber with an 8-wafer storage elevator, and from 1–4 plasma etching chambers.

The mobile cassette platform is maintained at atmospheric pressure during the entire operation of the apparatus. It holds two cassettes of wafers, each capable of holding up to 25 wafers. The platform can be raised or lowered and moved laterally so that any particular wafer may be aligned with a narrow door located between the platform and the transport chamber.

Nitrogen gas is fed through a flow control valve into the transport chamber to vent the chamber to atmosphere. A robot transfer arm in the transport chamber transfers wafers from the cassette on the mobile cassette platform to the storage elevator in the transport chamber.

The transport chamber is connected to a two stage evacuation pump which is used to evacuate the transport chamber and maintain it at a suitable pressure for transporting wafers from the elevator to the plasma etching chamber. This pressure was maintained at 75–125 mTorr.

The plasma etching chamber is connected to a turbo pump and the two stage pump which evacuates the chamber to a lower pressure than that of the transport chamber. This pressure is typically less than 10 mTorr.

When the transport chamber and the plasma etching chamber have reached suitable pressures for wafer transfer, the robot arm transfers a wafer from the wafer storage elevator to the plasma etch chamber.

The plasma etching chamber contains an upper, electrically grounded electrode which also serves as the chamber sidewalls, and a lower, RF powered electrode upon which the wafer is clamped during the plasma etch process, and a set of electromagnetic coils placed around the chamber sidewalls.

In one embodiment of the present invention, an etch chamber having an upper electrode (or anode) which is comprised of silicon is used. It is believed that the silicon scavenges the free fluorine from the reaction, and thereby substantially prevents the free fluorine from etching the nitride layer 16.

Figure 3:
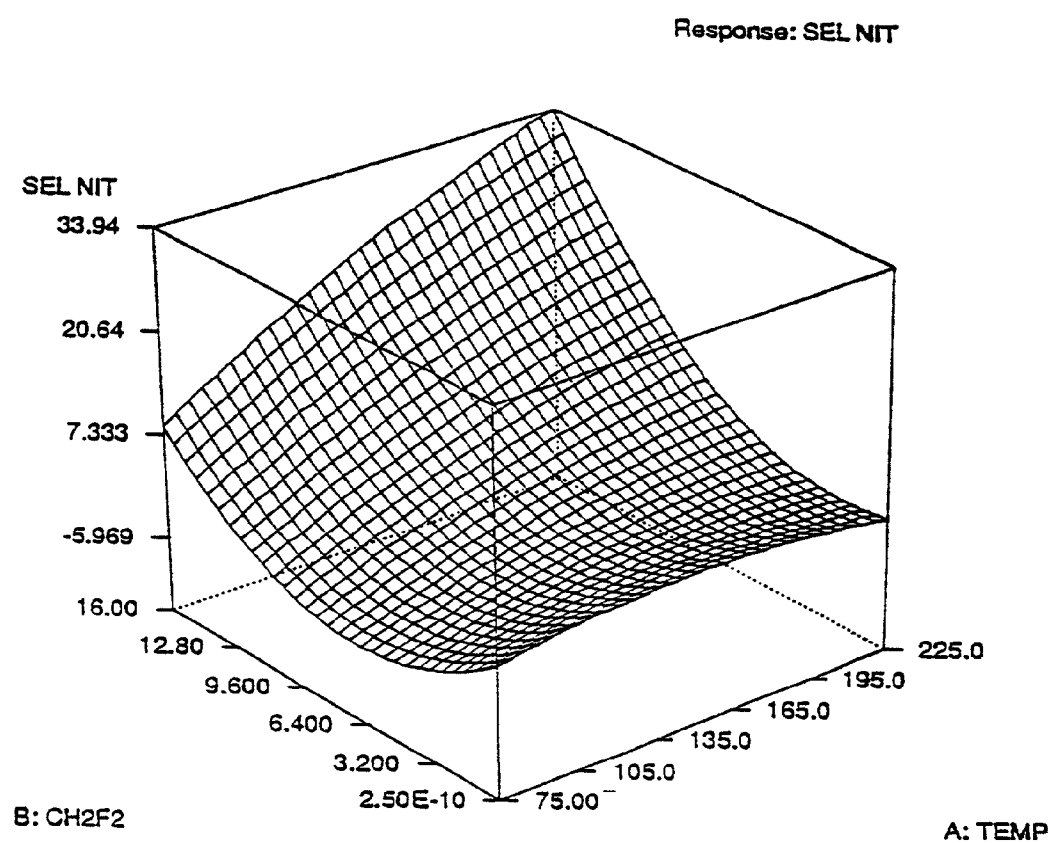
FIG. 3 is a plot of oxide:nitride selectivity in relation to both the silicon anode temperature and the addition of $CH_2F_2$.

In the process of the present invention, it has been unexpectedly found that an enhanced selectivity effect results with the addition of $CH_2F_2$ while using a hot silicon plate (or anode). For $CH_2F_2$ flows above 8 sccm, and silicon plate temperatures above 75° C., a significant result occurs, as depicted in plot of FIG. 3. At a silicon plate temperature of 225° C., the selectivity of oxide:nitride increases from 1.7:1 without $CH_2F_2$, to over 33:1 with the addition of 10 sccm $CH_2F_2$.

The chamber also contains a gas distribution plate connected to the lid of the chamber, through which suitable feed gas mixtures are fed into the chamber from a connected gas supply manifold.

When RF energy is applied to the lower electrode, the gas fed into the chamber, via the gas distribution plate, is converted to plasma. The plasma contains reactive chemical species which etch selected unmasked portions of the wafer, which wafer is clamped to the lower electrode.

Electric power is applied to the electromagnetic coils which surround the chamber sidewalls. The magnetic field generated by the coils increases the density of the plasma near the wafer surface. A throttle valve located between the plasma etching chamber regulates the pressure of the chamber to processing values, generally in the range of 10–350 mTorr.

The lower electrode is connected to a wafer cooling system designed to maintain the wafer at a constant temperature during the plasma etch process. This system consists of two parts. The first is an apparatus providing a temperature controlled fluid which circulates through a tunnel in the lower electrode.

The second part is an apparatus providing a pressure and flow controlled inert gas (typically helium) of high thermal conductivity which is fed to the underside of wafer during etch via a channel through the lower electrode, opening to grooves on the top face of the lower electrode. The helium gas is contained behind the wafer by an O-ring seal which lies partially in a circular groove in the lower electrode.

The second part is referred to as a helium backside cooling system. During plasma etches, power is dissipated in the plasma through the ionization of the gaseous species. During the ionization process, a large amount of heat is generated. The helium backside cooling system allows the heat which has been imparted to the wafer, to be more effectively coupled to the temperature controlled lower electrode. As the pressure in the helium cooling system is increased, the wafer temperature more closely matches the temperature of the lower electrode throughout the plasma process. Hence, a more stable and predictable process is possible.

When the clamp is lowered to clamp the wafer against the lower electrode, the wafer underside is held tightly against the O-ring seal. The seal prohibits leakage of the inert gas from underneath the wafer to the plasma etch cavity.

The machine is governed by a programmable computer that is programmed to prompt the machine to evacuate and vent the transport chamber and plasma etching chamber, transfer wafers to and from the cassettes, elevator, and etch chamber, control the delivery of process gas, RF power, and magnetic field to the plasma etching chamber, and maintain the temperature of the wafer in the plasma etching chamber, all at appropriate times and in appropriate sequence.

The multilayer 10 structure is then placed within the plasma etching chamber, and etched with a fluorinated chemical etchant system to form a predetermined pattern therein. The fluorinated chemical etchant system of the present invention comprises a chemical etchant composition, such as $CHF_3$, $CF_4$, and Ar, and an additive material. The fluorinated chemical etchant system is in a substantially gaseous phase during the etching of the multilayer structure 10.

In the case of the chemical etchant composition including $CHF_3$, $CF_4$ and Ar, and an additive material comprising $CH_2F_2$, the exposed $SiO_2$ layer 14 is selectively etched at a relatively high etch rate and high selectivity down to the $Si_3N_4$ etch "stop" layer 16. Predetermined portions of the $SiO_2$ layer 14 are removed using chemically enhanced ionic bombardment of the gas phase etchant material.

An inert gas, preferably argon (Ar), is added to the etch plasma, as it tends to further enhance the uniformity of the etch process. Argon is preferred because of its weight and commercial availability, but the other inert gases can also be used.

Heating the chamber sidewall and electrode (i.e., the wafer chuck) to higher than normal operating range, according to the present invention, produces an increase in oxide to nitride selectivity, contrary to the current teaching on high selectivity etching.

Heating the separate individual components of the chamber (e.g., sidewalls, chuck, helium backside, etc.) produced varying degrees of positive results when there was an overall increase in temperature.

Current process temperatures for highly selective etches include maintaining the etch chamber sidewalls at approximately 50° C., and the lower electrode at approximately 20° C. or below, and a helium backside pressure in the approximate range of 4.0–12.0 torr.

In contrast, the preferred embodiment of the present invention involves increasing the temperature of the chamber sidewalls to a temperature in the approximate range of 50° C.–100° C., and the temperature of the lower electrode is in the approximate range of 30° C.–100° C., and preferably in the range of 30° C.–70° C. The helium backside cooling apparatus is maintained at a pressure in the approximate range of 4.0 torr or less. Decreasing the pressure of the helium backside cooling apparatus, essentially translates to increasing the temperature.

The reaction chamber can be heated via a fluid system, in which a fluid, such as, for example, water, at a desired temperature is flowed around the chamber walls. Alternatively, a gas can be flowed to heat the system.

However, temperature increases in the lid or anode has produced negative results. Therefore, it is critical that the right combination of higher temperatures be maintained to produce the best selectivity. If the anode is increased to a temperature over 90° C., the photoresist layer 12 will begin to burn and reticulate. This upper temperature limitation is governed by the masking material and should not be viewed as a hard limit.

It is believed that increasing the temperature, also increases the rate of generation of the particular polymer species, and consequently is responsible for the increase in oxide to nitride selectivity. By increasing the temperature of the chamber, chuck, and sidewall, the selectivity is increased. Further, as the backside helium cooling was reduced, (in effect heating the wafer), the selectivity also increased.

The use of temperature control in the present invention further helps to minimize polymer build-up on the surfaces of the reaction chamber. Limiting polymer build-up substantially decreases possible contaminants, as well as downtime of the apparatus for cleaning.

Representative etch parameters were employed in the process for etching a multilayer structure 10 of the present invention. One having ordinary skill in the art will realize that the above values will vary depending on the make and model of the etcher used in the process.

The flow rates of the component gases, based on the total gas flow of the fluorinated chemical etchant system, used herein was as follows: an etchant comprised of 16% CF4, 60% Ar, 9% CH2F2, and 13% CHF3, at a total pressure in the system of 225 mTorr, magnetic field maintained at 75 gauss, and RF power applied at 425 watts.

The parameters of the present invention are within the following approximate ranges: an etchant material comprised of 14 sccm CH2F2, 25 sccm CF4, 90 sccm AR, and 20 sccm CHF3, at a total pressure in the system of 225 mTorr magnetic field maintained at 75 gauss, and RF power applied at 425 watts.

Silicon dioxide and silicon nitride layers, 14 and 16 respectively, were patterned with etch masks 12 having the appropriate etch mask openings 12a and geometries. The wafers were then etched, thereby creating a substantially vertical profile in the respective films.

Figure 4A:
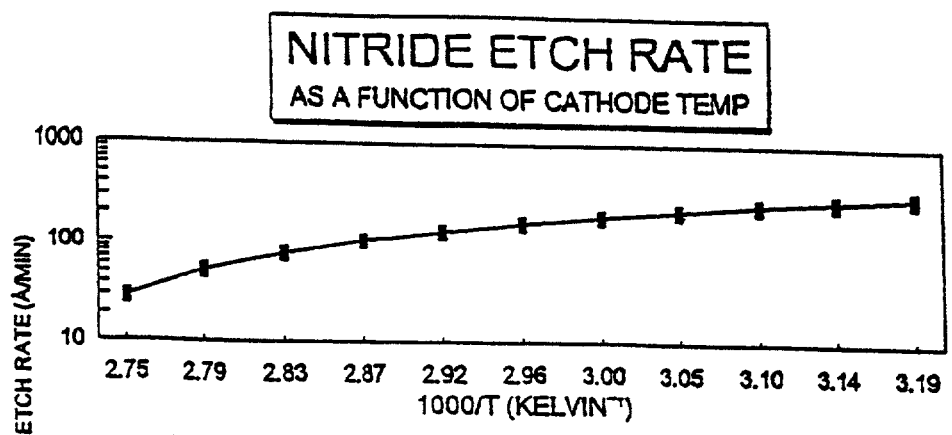
FIGS. 4a–4c are Arrhenius plots illustrating the unexpected results obtained with the process of the present invention.
Figure 4B:
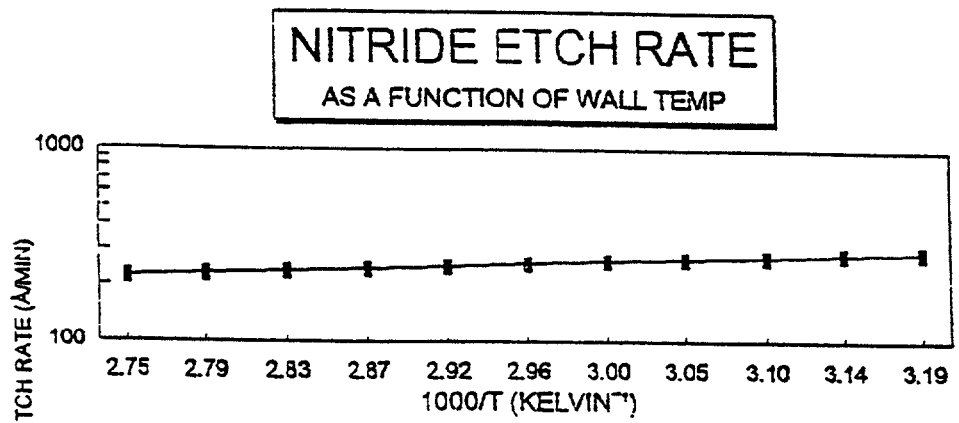
Figure 4C:
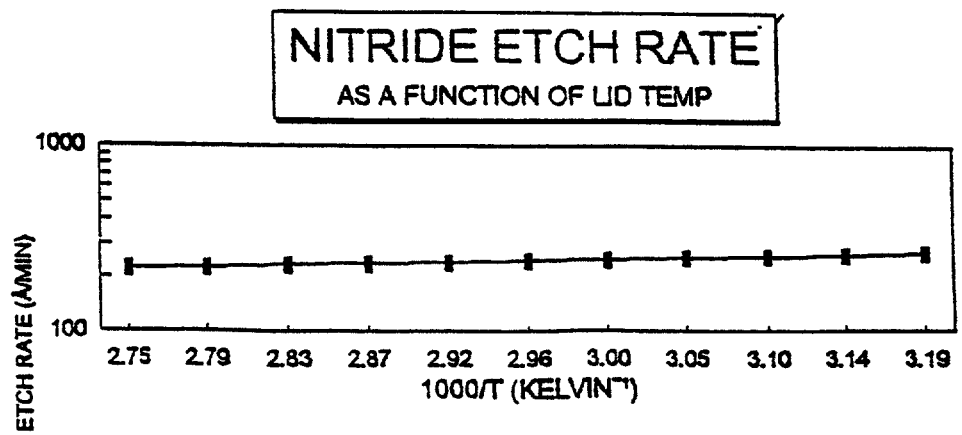

FIGS. 4a, 4b, and 4c illustrate the etch selectivities which were obtained using the process of the present invention. FIG. 4a depicts the positive slope obtained on an Arrhenius plot, which slope indicates that the nitride etch rate decreases as a function of increased electrode temperature.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

For example, one having ordinary skill in the art will realize that the present invention is also useful in etching an oxide/nitride/oxide (ONO) stack.

What is claimed is:

1. A method of etching a semiconductor wafer comprising a silicon oxide layer formed over a silicon nitride layer, the method comprising plasma etching the silicon oxide layer in an etchant environment comprising a fluorohydrocarbon, wherein the fluorohydrocarbon contains at least as many hydrogen atoms as fluorine atoms, and wherein the etchant environment provides silicon oxide-to-silicon nitride selectivity.

2. The method of claim 1, wherein the fluorohydrocarbon is $CH_3F$.

3. The method of claim 1, wherein the fluorohydrocarbon contains the same number of hydrogen and fluorine atoms.

4. The method of claim 3, wherein the fluorohydrocarbon is $CH_2F_2$.

5. The method of claim 1, wherein the etchant environment further comprises a fluorinated gas.

6. The method of claim 5, wherein the fluorinated gas is selected from the group consisting of $CF_4$ and $CHF_3$.

7. The method of claim 5, wherein the etchant environment further comprises an inert gas.

8. The method of claim 7, wherein the inert gas is argon.

9. The method of claim 1, wherein the silicon oxide layer is formed directly above the silicon nitride layer.

10. The method of claim 1, wherein the silicon oxide is selected from the group consisting of undoped silicon oxide and doped silicon oxide.

11. The method of claim 1, wherein the silicon nitride layer is formed with an uneven topography.

12. The method of claim 1, wherein the semiconductor wafer further comprises two conductors, wherein the silicon nitride layer is formed above the conductors, and wherein the plasma etching forms an opening in the silicon oxide between the conductors.

13. The method of claim 1, further comprising heating the semiconductor wafer during plasma etching.

14. The method of claim 13, wherein the semiconductor wafer is heated to between about 20 and 80 degrees C.

15. The method of claim 13, wherein the semiconductor wafer is heated to between about 30 and 60 degrees C.

16. The method of claim 13, wherein the semiconductor wafer is heated to between about 35 and 50 degrees C.

17. The method of claim 13, wherein the semiconductor wafer is heated by heating an electrode adjacent to the semiconductor wafer.

18. The method of claim 17, wherein the electrode is heated to between about 20 and 80 degrees C.

19. The method of claim 17, wherein the electrode is heated to between about 30 and 60 degrees C.

20. The method of claim 17, wherein the electrode is heated to between about 35 and 50 degrees C.

21. The method of claim 1, wherein the silicon oxide-to-silicon nitride selectivity is greater than or equal to 10-to-1.

22. The method of claim 1, wherein the silicon oxide-to-silicon nitride selectivity is greater than or equal to 20-to-1.

23. The method of claim 1, wherein the silicon oxide-to-silicon nitride selectivity is greater than or equal to 30-to-1.

24. A method of etching a semiconductor wafer comprising a silicon oxide layer formed over a silicon nitride layer, the method comprising plasma etching the semiconductor wafer in an etchant environment, wherein the method comprises heating the semiconductor wafer during plasma etching to increase the silicon oxide-to-silicon nitride selectivity, wherein the etchant environment comprises a fluorohydrocarbon, wherein the fluorohydrocarbon contains at least as many hydrogen atoms as fluorine atoms.

25. The method of claim 24, wherein the fluorohydrocarbon is $CH_3F$.

26. The method of claim 24, wherein the fluorohydrocarbon contains the same number of hydrogen and fluorine atoms.

27. The method of claim 26, wherein the fluorohydrocarbon is $CH_2F_2$.

28. The method of claim 24, wherein the etchant environment further comprises a fluorinated gas.

29. The method of claim 28, wherein the fluorinated gas is selected from the group consisting of $CF_4$ and $CHF_3$.

30. The method of claim 28, wherein the etchant environment further contains an inert gas.

31. The method of claim 30, wherein the inert gas is argon.

32. The method of claim 24, wherein the semiconductor wafer is heated to between about 20 and 80 degrees C.

33. The method of claim 24, wherein the semiconductor wafer is heated to between about 30 and 60 degrees C.

34. The method of claim 24, wherein the semiconductor wafer is heated to between about 35 and 50 degrees C.

35. The method of claim 24, wherein the semiconductor wafer is heated by heating an electrode adjacent to the semiconductor wafer.

36. The method of claim 35, wherein the electrode is heated to between about 20 and 80 degrees C.

37. The method of claim 35, wherein the electrode is heated to between about 30 and 60 degrees C.

38. The method of claim 35, wherein the electrode is heated to between about 35 and 50 degrees C.

39. The method of claim 24, wherein the silicon oxide-to-silicon nitride selectivity is greater than or equal to 10-to-1.

40. The method of claim 24, wherein the silicon oxide-to-silicon nitride selectivity is greater than 20–1.

41. The method of claim 24, wherein the silicon oxide-to-silicon nitride selectivity is greater than or equal to 30-to-1.

42. The method of claim 24, wherein the silicon oxide layer is formed directly above the silicon nitride layer.

43. The method of claim 24, wherein the silicon oxide is selected from the group consisting of undoped silicon oxide and doped silicon oxide.

44. The method of claim 24, wherein the silicon nitride layer is formed with an uneven topography.

45. The method of claim 24, wherein the semiconductor wafer further comprises two conductors, wherein the silicon nitride layer is formed above the conductors, and wherein the plasma etching forms an opening in the silicon oxide between the conductors.

46. A method of etching a semiconductor wafer containing a silicon oxide layer formed over a silicon nitride layer, the method comprising plasma etching the semiconductor wafer using an etch environment that provides a silicon oxide-to-silicon nitride selectivity of greater than or equal to 10-to-1, wherein the etch environment comprises a fluorohydrocarbon, wherein the fluorohydrocarbon contains at least as many hydrogen atoms as fluorine atoms.

47. The method of claim 46, wherein the etch environment comprises a first gas selected from the group comprising $CH_3F$ and $CH_2F_2$.

48. The method of claim 47, wherein the etch environment further comprises a second fluorinated gas.

49. The method of claim 48, wherein the second fluorinated gas is selected from the group consisting of $CF_4$ and $CHF_3$.

50. The method of claim 48, wherein the etch environment further comprises an inert gas.

51. The method of claim 50, wherein the inert gas is argon.

52. The method of claim 46, further comprising heating the semiconductor wafer during plasma etching.

53. The method of claim 52, wherein the semiconductor wafer is heated to between about 20 and 80 degrees C.

54. The method of claim 52, wherein the semiconductor wafer is heated to between about 30 and 60 degrees C.

55. The method of claim 52, wherein the semiconductor wafer is heated to between about 35 and 50 degrees C.

56. The method of claim 52, wherein the semiconductor wafer is heated by heating an electrode adjacent to the semiconductor wafer.

57. The method of claim 56, wherein the electrode is heated to between about 20 and 80 degrees C.

58. The method of claim 56, wherein the electrode is heated to between about 30 and 60 degrees C.

59. The method of claim 56, wherein the electrode is heated to between about 35 and 50 degrees C.

60. The method of claim 47, wherein the silicon oxide-to-silicon nitride selectivity is greater than or equal to 20-to-1.

61. The method of claim 47, wherein the silicon oxide-to-silicon nitride selectivity is greater than or equal to 30-to-1.

62. The method of claim 47, wherein the silicon oxide-to-silicon nitride selectivity is greater than or equal to 50-to-1.

63. The method of claim 52, wherein the silicon oxide-to-silicon nitride selectivity is greater than or equal to 20-to-1.

64. The method of claim 52, wherein the silicon oxide-to-silicon nitride selectivity is greater than or equal to 30-to-1.

65. The method of claim 46, wherein the silicon oxide-to-silicon nitride selectivity is greater than or equal to 20-to-1.

66. The method of claim 46, wherein the silicon oxide-to-silicon nitride selectivity is greater than or equal to 30-to-1.

67. The method of claim 46, wherein the silicon oxide-to-silicon nitride selectivity is greater than or equal to 50-to-1.

68. The method of claim 46, wherein the silicon oxide layer is formed directly above the silicon nitride layer.

69. The method of claim 46, wherein the silicon oxide is selected from the group consisting of undoped silicon oxide and doped silicon oxide.

70. The method of claim 46, wherein the silicon nitride layer is formed with an uneven topography.

71. The method of claim 46, wherein the semiconductor wafer further comprises two conductors, wherein the silicon nitride layer is formed above the conductors, and wherein the plasma etching forms an opening in the silicon oxide between the conductors.

72. The method of claim 12, wherein the conductors are comprised of polysilicon.

73. The method of claim 45, wherein the conductors are comprised of polysilicon.

74. The method of claim 71, wherein the conductors are comprised of polysilicon.

75. A method of etching a semiconductor wafer comprising a silicon oxide layer formed over a silicon nitride layer, the method comprising plasma etching the semiconductor wafer in an etchant environment, wherein the method comprises heating the semiconductor wafer during plasma etching to increase the silicon oxide-to-silicon nitride selectivity, wherein the semiconductor wafer is heated by heating an electrode adjacent to the semiconductor wafer.

76. The method of claim 75, wherein the etchant environment comprises a fluorohydrocarbon, wherein the fluorohydrocarbon contains at least as many hydrogen atoms as fluorine atoms.

77. The method of claim 76, wherein the fluorohydrocarbon is $CH_3F$.

78. The method of claim 75, wherein the etchant environment comprises a fluorohydrocarbon, wherein the fluorohydrocarbon contains the same number of hydrogen and fluorine atoms.

79. The method of claim 78, wherein the fluorohydrocarbon is $CH_2F_2$.

80. The method of claim 75, wherein the etchant environment further comprises a fluorinated gas.

81. The method of claim 80, wherein the fluorinated gas is selected from the group consisting of $CF_4$ and $CHF_3$.

82. The method of claim 80, wherein the etchant environment further contains an inert gas.

83. The method of claim 82, wherein the inert gas is argon.

84. The method of claim 75, wherein the semiconductor wafer is heated to between about 20 and 80 degrees C.

85. The method of claim 75, wherein the semiconductor wafer is heated to between about 30 and 60 degrees C.

86. The method of claim 75, wherein the semiconductor wafer is heated to between about 35 and 50 degrees C.

87. The method of claim 75, wherein the electrode is heated to between about 20 and 80 degrees C.

88. The method of claim 75, wherein the electrode is heated to between about 30 and 60 degrees C.

89. The method of claim 75, wherein the electrode is heated to between about 35 and 50 degrees C.

90. The method of claim 75, wherein the silicon oxide-to-silicon nitride selectivity is greater than or equal to 10-to-1.

91. The method of claim 75, wherein the silicon oxide-to-silicon nitride selectivity is greater than 20–1.

92. The method of claim 75, wherein the silicon oxide-to-silicon nitride selectivity is greater than or equal to 30-to-1.

93. The method of claim 75, wherein the silicon oxide layer is formed directly above the silicon nitride layer.

94. The method of claim 75, wherein the silicon oxide is selected from the group consisting of undoped silicon oxide and doped silicon oxide.

95. The method of claim 75, wherein the silicon nitride layer is formed with an uneven topography.

96. The method of claim 75, wherein the semiconductor wafer further comprises two conductors, wherein the silicon nitride layer is formed above the conductors, and wherein the plasma etching forms an opening in the silicon oxide between the conductors.

97. The method of claim 96, wherein the conductors are comprised of polysilicon.

98. A method of etching a semiconductor wafer containing a silicon oxide layer formed over a silicon nitride layer, the method comprising plasma etching the semiconductor wafer using an etch environment that provides a silicon oxide-to-silicon nitride selectivity of greater than or equal to 10-to-1, wherein the semiconductor wafer is heated during plasma etching by heating an electrode adjacent to the semiconductor wafer.

99. The method of claim 98, wherein the etch environment comprises a first gas selected from the group comprising $CH_3F$ and $CH_2F_2$.

100. The method of claim 99, wherein the etch environment further comprises a second fluorinated gas.

101. The method of claim 100, wherein the second fluorinated gas is selected from the group consisting of $CF_4$ and $CHF_3$.

102. The method of claim 100, wherein the etch environment further comprises an inert gas.

103. The method of claim 102, wherein the inert gas is argon.

104. The method of claim 100, wherein the electrode is heated to between about 20 and 80 degrees C.

105. The method of claim 100, wherein the electrode is heated to between about 30 and 60 degrees C.

106. The method of claim 100, wherein the electrode is heated to between about 35 and 50 degrees C.

107. The method of claim 100, wherein the silicon oxide-to-silicon nitride selectivity is greater than or equal to 20-to-1.

108. The method of claim 100, wherein the silicon oxide-to-silicon nitride selectivity is greater than or equal to 30-to-1.

109. The method of claim 100, wherein the silicon oxide-to-silicon nitride selectivity is greater than or equal to 50-to-1.

110. The method of claim 100, wherein the silicon oxide layer is formed directly above the silicon nitride layer.

111. The method of claim 100, wherein the silicon oxide is selected from the group consisting of undoped silicon oxide and doped silicon oxide.

112. The method of claim 100, wherein the silicon nitride layer is formed with an uneven topography.

113. The method of claim 98, wherein the semiconductor wafer further comprises two conductors, wherein the silicon nitride layer is formed above the conductors, and wherein the plasma etching forms an opening in the silicon oxide between the conductors.

114. The method of claim 113, wherein the conductors are comprised of polysilicon.

* * * * *

UNITED STATES PATENT AND TRADEMARK OFFICE
CERTIFICATE OF CORRECTION

| | | |
|---|---|---|
| PATENT NO. | : 7,049,244 B2 | Page 1 of 2 |
| APPLICATION NO. | : 09/923058 | |
| DATED | : May 23, 2006 | |
| INVENTOR(S) | : David S. Becker et al. | |

It is certified that error appears in the above-identified patent and that said Letters Patent is hereby corrected as shown below:

On Title, Item (75):
add Inventor: --Lyle Breiner, Meridian ID (US)--

In column 12, claim 104, line 19:
"claim 100" should be --claim 98--

In column 12, claim 105, line 21:
"claim 100" should be --claim 98--

In column 12, claim 106, line 23:
"claim 100" should be --claim 98--

In column 12, claim 107, line 25:
"claim 100" should be --claim 98--

In column 12, claim 108, line 28:
"claim 100" should be --claim 98--

In column 12, claim 109, line 31:
"claim 100" should be --claim 98--

In column 12, claim 110, line 34:
"claim 100" should be --claim 98--

UNITED STATES PATENT AND TRADEMARK OFFICE
CERTIFICATE OF CORRECTION

PATENT NO. : 7,049,244 B2
APPLICATION NO. : 09/923058
DATED : May 23, 2006
INVENTOR(S) : David S. Becker et al.

It is certified that error appears in the above-identified patent and that said Letters Patent is hereby corrected as shown below:

In column 12, claim 111, line 36:
"claim 100" should be --claim 98--

In column 12, claim 112, line 39:
"claim 100" should be --claim 98--

Signed and Sealed this

Second Day of September, 2008

JON W. DUDAS
*Director of the United States Patent and Trademark Office*